United States Patent
de Jong et al.

(10) Patent No.: US 9,524,851 B2
(45) Date of Patent: Dec. 20, 2016

(54) METHOD OF PERFORMING SPECTROSCOPY IN A TRANSMISSION CHARGED-PARTICLE MICROSCOPE

(71) Applicant: FEI Company, Hillsboro, OR (US)

(72) Inventors: Erwin Fernand de Jong, Best (NL); Sorin Lazar, Eindhoven (NL); Peter Christiaan Tiemeijer, Eindhoven (NL); Rudolf Geurink, 's-Hertogenbosch (NL)

(73) Assignee: FEI COMPANY, Hillsboro, OR (US)

( * ) Notice: Subject to any disclaimer, the term of this patent is extended or adjusted under 35 U.S.C. 154(b) by 0 days.

(21) Appl. No.: 14/844,778

(22) Filed: Sep. 3, 2015

(65) Prior Publication Data

US 2016/0071689 A1    Mar. 10, 2016

(30) Foreign Application Priority Data

Sep. 4, 2014    (EP) .................................... 14183576

(51) Int. Cl.
*H01J 37/26*    (2006.01)
*H01J 37/22*    (2006.01)
(Continued)

(52) U.S. Cl.
CPC ............ *H01J 37/226* (2013.01); *H01J 37/147* (2013.01); *H01J 37/20* (2013.01); *H01J 37/261* (2013.01);
(Continued)

(58) Field of Classification Search
USPC ................ 250/305, 306, 307, 309, 310, 311
See application file for complete search history.

(56) References Cited

U.S. PATENT DOCUMENTS 7,642,513 B2    1/2010 Pinna et al.
8,334,512 B2    12/2012 Luecken et al.
(Continued)

FOREIGN PATENT DOCUMENTS

EP    2387062    11/2011

OTHER PUBLICATIONS

"Electron Energy Loss Spectroscopy", Wikipedia, Accessed Dec. 1, 2015, 5 pages. <https://en.wikipedia.org/wiki/Electron_energy_loss_spectroscopy>.

(Continued)

*Primary Examiner* — Nicole Ippolito
(74) *Attorney, Agent, or Firm* — Scheinberg & Associates, P.C.; Michael O. Scheinberg

(57) ABSTRACT

A method of performing spectroscopy in a Transmission Charged-Particle Microscope comprising:
  a specimen holder;
  a source, for producing a beam of charged particles;
  an illuminator, for directing said beam so as to irradiate the specimen;
  an imaging system, for directing a flux of charged particles transmitted through the specimen onto a spectroscopic apparatus comprising a dispersing device for dispersing said flux into an energy-resolved array of spectral sub-beams,
the method comprising:
using an adjustable aperture device to admit a first portion of said array to a detector, while blocking a second portion of said array;
providing;
using a radiation sensor in said flux upstream of said aperture device to perform localized radiation sensing in a selected region of said second portion of the array, simultaneous with detection of said first portion by said detector;

(Continued)

Figure 1:
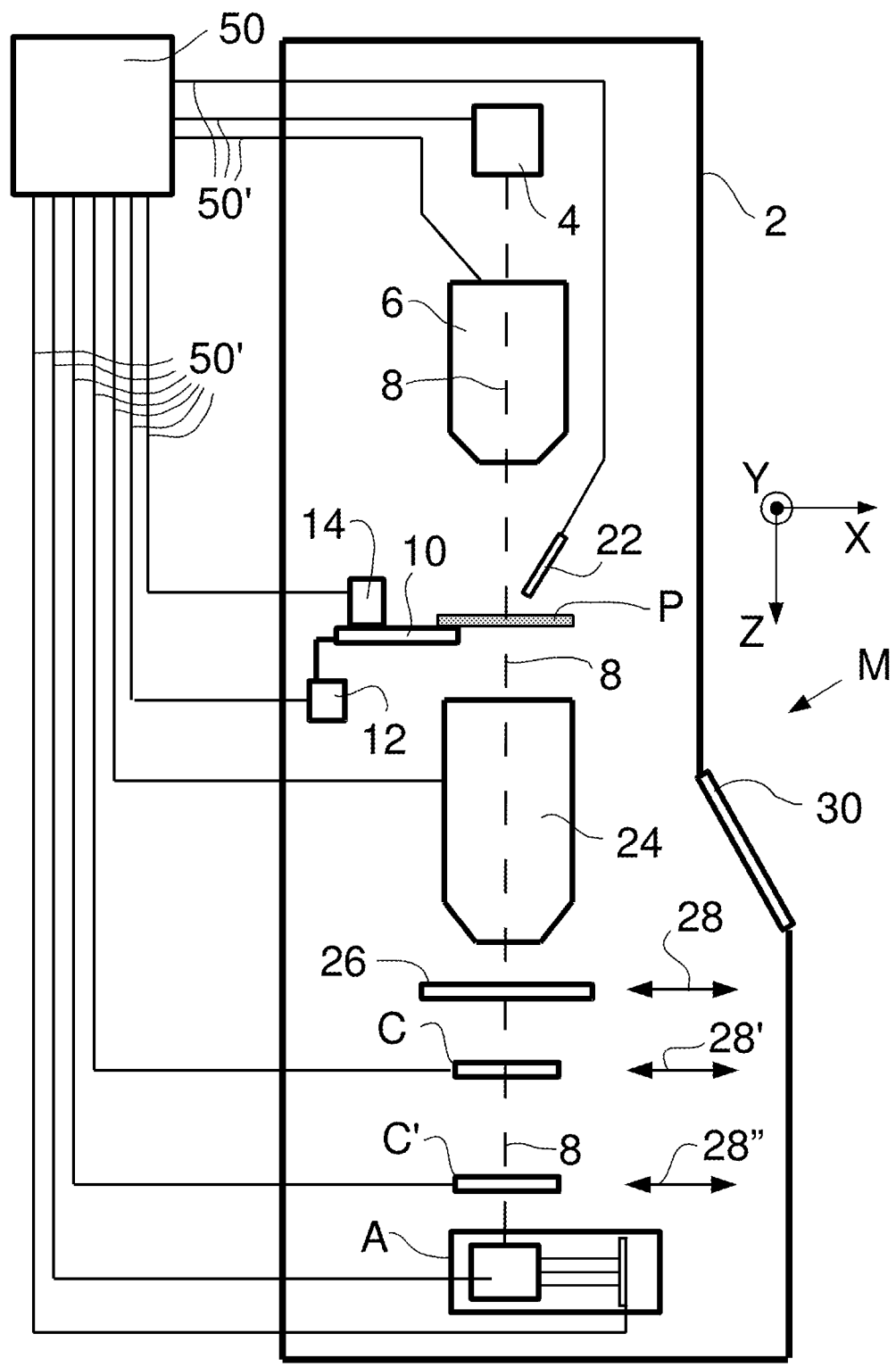

using a sensing result from said sensor to adjust a detection result from said detector.

18 Claims, 3 Drawing Sheets

(51) Int. Cl.
*H01J 37/28* (2006.01)
*H01J 37/20* (2006.01)
*H01J 37/147* (2006.01)

(52) U.S. Cl.
CPC ............ *H01J 37/28* (2013.01); *H01J 2237/15* (2013.01); *H01J 2237/2007* (2013.01); *H01J 2237/2802* (2013.01)

(56) References Cited

U.S. PATENT DOCUMENTS

| | | | |
|---|---|---|---|
| 8,653,457 B2 | 2/2014 | Stoks | |
| 2009/0114818 A1* | 5/2009 | Casares | H01J 37/045 250/307 |
| 2010/0320382 A1* | 12/2010 | Almogy | H01J 37/05 250/307 |
| 2012/0112086 A1* | 5/2012 | Tsai | B82Y 10/00 250/393 |
| 2013/0228683 A1* | 9/2013 | Boughorbel | H01J 37/222 250/307 |
| 2013/0286191 A1* | 10/2013 | Ito | G01N 21/47 348/131 |
| 2015/0009489 A1 | 1/2015 | Mulders et al. | |

OTHER PUBLICATIONS

"Energy Filtered Transmission Electron Microscopy", Wikipedia, Accessed Dec. 1, 2015, 2 pages. <https://en.wikipedia.org/wiki/Energy_filtered_transmission_electron_microscopy>.

"Electron Microscope", Wikipedia, Accessed Oct. 15, 2015, 11 pages. <https://en.wikipedia.org/wiki/Electron_microscope>.

"Scanning Electron Microscope", Wikipedia, Accessed Oct. 15, 2015, 18 pages. <https://en.wikipedia.org/wiki/Scanning_electron_microscope>.

"Transmission Electron Microscopy", Wikipedia, Accessed Oct. 15, 2015, 23 pages. <https://en.wikipedia.org/wiki/Transmission_electron_microscopy>.

"Scanning Transmission Electron Microscopy", Wikipedia, Accessed Oct. 15, 2015, 5 pages. <https://en.wikipedia.org/wiki/Scanning_transmission_electron_microscopy>.

"Scanning Helium Ion Microscope", Wikipedia, Accessed Oct. 15, 2015, 2 pages. <https://en.wikipedia.org/wiki/Scanning_Helium_Ion_Microscope>.

W. H. Escovitz et al., "Scanning Transmission Ion Microscope with a Field Ion Source", Proc. Nat. Acad. Sci. USA, vol. 72, No. 5, pp. 1826-1828, May 1975, 3 pages.

* cited by examiner

METHOD OF PERFORMING SPECTROSCOPY IN A TRANSMISSION CHARGED-PARTICLE MICROSCOPE

The invention relates to a method of performing spectroscopy in a Transmission Charged-Particle Microscope comprising:
- A specimen holder, for holding a specimen;
- A source, for producing a beam of charged particles;
- An illuminator, for directing said beam so as to irradiate the specimen;
- An imaging system, for directing a flux of charged particles transmitted through the specimen onto a spectroscopic apparatus comprising a dispersing device for dispersing said flux into an energy-resolved array of spectral sub-beams.

The invention also relates to a Transmission Charged-Particle Microscope in which such a method can be performed.

Charged-particle microscopy is a well-known and increasingly important technique for imaging microscopic objects, particularly in the form of electron microscopy. Historically, the basic genus of electron microscope has undergone evolution into a number of well-known apparatus species, such as the Transmission Electron Microscope (TEM), Scanning Electron Microscope (SEM), and Scanning Transmission Electron Microscope (STEM), and also into various sub-species, such as so-called "dual-beam" tools (e.g. a FIB-SEM), which additionally employ a "machining" Focused Ion Beam (FIB), allowing supportive activities such as ion-beam milling or Ion-Beam-Induced Deposition (IBID), for example. More specifically:
- In a SEM, irradiation of a specimen by a scanning electron beam precipitates emanation of "auxiliary" radiation from the specimen, in the form of secondary electrons, backscattered electrons, X-rays and photoluminescence (infrared, visible and/or ultraviolet photons), for example; one or more components of this emanating radiation is/are then detected and used for image accumulation purposes, and/or spectroscopic analysis (as in the case of EDX (Energy-Dispersive X-Ray Spectroscopy), for example).
- In a TEM, the electron beam used to irradiate the specimen is chosen to be of a high-enough energy to penetrate the specimen (which, to this end, will generally be thinner than in the case of a SEM specimen); the flux of transmitted electrons emanating from the specimen can then be used to create an image, or produce a spectrum (as in the case of EELS (Electron Energy-Loss Spectroscopy), for example). If such a TEM is operated in scanning mode (thus becoming a STEM), the image/spectrum in question will be accumulated during a scanning motion of the irradiating electron beam.

More information on some of the topics elucidated here can, for example, be gleaned from the following Wikipedia links:
http://en.wikipedia.org/wiki/Electron_microscope
http://en.wikipedia.org/wiki/Scanning_electron_microscope
http://en.wikipedia.org/wiki/Transmission_electron_microscopy
http://en.wikipedia.org/wiki/Scanning_transmission_electron_microscopy As an alternative to the use of electrons as irradiating beam, charged-particle microscopy can also be performed using other species of charged particle. In this respect, the phrase "charged particle" should be broadly interpreted as encompassing electrons, positive ions (e.g. Ga or He ions), negative ions, protons and positrons, for instance. As regards ion-based microscopy, some further information can, for example, be gleaned from sources such as the following:
http://en.wikipedia.org/wiki/Scanning_Helium_Ion_Microscope
W. H. Escovitz, T. R. Fox and R. Levi-Setti, *Scanning Transmission Ion Microscope with a Field Ion Source*, Proc. Nat. Acad. Sci. USA 72(5), pp 1826-1828 (1975).

It should be noted that, in addition to imaging and/or spectroscopy, a charged-particle microscope (CPM) may also have other functionalities, such as examining diffractograms, performing (localized) surface modification (e.g. milling, etching, deposition), etc.

In all cases, a Transmission Charged-Particle Microscope (TCPM) will comprise at least the following components:
- A radiation source, such as a Schottky electron source or ion gun.
- An illuminator, which serves to manipulate a "raw" radiation beam from the source and perform upon it certain operations such as focusing, aberration mitigation, cropping (with a stop/iris/condensing aperture), filtering, etc. It will generally comprise one or more charged-particle lenses, and may comprise other types of particle-optical component also. If desired, the illuminator can be provided with a deflector system that can be invoked to cause its output beam to perform a scanning motion across the specimen being investigated.
- A specimen holder, on which a specimen under investigation can be held and positioned (e.g. tilted, rotated). If desired, this holder can be moved so as to effect a scanning motion of the beam w.r.t. the specimen. In general, such a specimen holder will be connected to a positioning system such as a mechanical stage.
- An imaging system, which essentially takes charged particles that are transmitted through a specimen (plane) and directs (focuses) them onto analysis apparatus, such as a detection/imaging device, spectroscopic apparatus, etc. As with the illuminator referred to above, the imaging system may also perform other functions, such as aberration mitigation, cropping, filtering, etc., and it will generally comprise one or more charged-particle lenses and/or other types of particle-optical components.

When a spectroscopic apparatus as referred to here is present, it will generally comprise:
- A dispersing device (comprising one or more "charged-particle prisms"), to disperse an incoming flux of charged particles (from the imaging system) into an energy-resolved array of spectral sub-beams, which can ultimately be directed onto a detection surface so as to form a spectrum. Basically, said incoming flux will contain electrons of various energies, and the dispersing device will "fan these out" (along a dispersion direction) into a collection (array) of individual sub-beams of given energies (in a manner somewhat reminiscent of a mass spectrometer).

A TCPM will also make use of:
- A detector, which may be unitary or compound/distributed in nature, and which can take many different forms, depending on the radiation/entity being recorded. As indicated above, such a detector may, for example, be used to register an intensity value, to capture an image, or to record a spectrum. Examples include photomultipliers (including solid-state photomultipliers, SSPMs), photodiodes, (pixelated) CMOS detectors, (pixelated) CCD detectors, photovoltaic cells, etc., which may, for example, be used in conjunction with a scintillator film, for instance.

In what follows, the invention may—by way of example—sometimes be set forth in the specific context of electron microscopy. However, such simplification is intended solely for clarity/illustrative purposes, and should not be interpreted as limiting.

An example of a TCPM as set forth above is a (S)TEM that is provided with an EELS module. Electron Energy-Loss Spectroscopy (EELS) is a technique used in (S)TEMs to obtain chemical information pertaining to a given specimen. A moving electron in an irradiating beam (from the (S)TEM's illuminator) can transfer energy to a bound electron in a core shell of an atom in the specimen, and promote this core electron to an outer shell (inelastic scattering). This energy-transfer from the moving electron gives rise to a so-called "core-loss peak" (CLP) in the EELS spectrum. The (coarse) position (in energy units) of the CLP is element-specific, and its precise position and shape are specific to the element's chemical environment and bonding. Typically, EELS modules can also be used as energy-selective imaging devices (EFTEMs: Energy-Filtered TEMs). To achieve this, they employ a slit ("letterbox") at/proximal their (primary) spectrum plane. When the module is used as a pure spectrometer, this slit is retracted, and the spectrum plane can be magnified and imaged onto the employed detector (camera) using post-slit optics. On the other hand, when the module is used as an energy-selective imaging device, the slit can be invoked to pass/admit only a specific energy window (typically of the order of 10-50 eV wide); in that case, the post-slit optics then image a Fourier Transform plane of said spectrum plane onto the detector. For more information on EELS and EFTEM, reference is made to the following links:
http://en.wikipedia.org/wiki/Electron_energy_loss_spectroscopy
http://en.wikipedia.org/wiki/Energy_filtered_transmission_electron_microscopy
and also to the book by Ray Egerton, *Electron Energy-Loss Spectroscopy in the Electron Microscope*, third edition, 2011, ISBN 978-1-4419-9583-4, Springer Science & Business Media (pub.).

Because of possible instabilities/fluctuations in the (high-tension) electrical power supplied to the illuminator, imaging system, source and/or EELS module, a precise measurement of the position of the CLP requires simultaneous or near-simultaneous recording of the CLP and the un-scattered component of the irradiating electron beam (the so-called "zero loss peak", ZLP). This is conventionally referred to as "tracking the ZLP", which inter alia acts as a metric for noise levels and an absolute energy scale reference for the CLP. Simultaneous recording of the ZLP and the CLP is typically not straightforward, inter alia because of the generally large intensity difference between the ZLP and the CLP (which can easily be of the order of 1000) and the generally large (energy) separation between the ZLP and the CLP (which can easily be of the order of 500 eV (electron volts), where 0.2 eV resolution is required/desired). Presently, near-simultaneous recording can be achieved using a so-called "Dual EELS" technique, e.g. as set forth in U.S. Pat. No. 7,642,513. In Dual EELS, two exposures are made in a single acquisition on the employed detector (e.g. a pixelated CCD camera), where one relatively short exposure (~1 μs, thus requiring an ultra-fast beam blanker/exposure shutter) is to record the ZLP, and a longer exposure (~10 ms) is to record the CLP (or, more generally, a set/spectrum of CLPs). In between these two exposures, ultra-fast deflectors are used to switch a different portion of the spectrum onto a different position on the detector. State-of-the-art Dual EELS equipment can, for example, record up to 1000 dual spectra per second.

In addition to the ZLP and CLPs referred to above, an EELS spectrum will generally also contain so-called "Plasmon Resonance Peaks" (PRPs), i.e. a relatively broad series of peaks/shoulders associated with single or multiple scattering of electrons on plasmons in the specimen. These PRPs occur between the ZLP and CLPs, and typically lie in the energy range 0-50 eV. Since a given incoming electron in the irradiating beam can (ultimately) undergo multiple scattering events, the CLP spectrum (inner-shell events) will typically by convoluted with/by the PRP spectrum (outer-shell events). Therefore, for a proper interpretation and quantification of the CLP spectrum, the PRP components must be measured and deconvoluted from the CLP components. For reasons similar to those set forth in the previous paragraph (i.e. large intensity difference and energy separation), the PRP spectral component generally cannot be recorded in a single exposure together with the ZLP and CLP components. Therefore, one must adopt a different approach, such as an augmented version of the Dual EELS approach set forth above, in which a triple rather than a dual exposure is made (one exposure each for the ZLP, PRP and CLP spectral segments).

As discussed above, the (standard or augmented) Dual EELS technique requires the use of ultra-fast deflectors and beam blankers, which are relatively expensive, bulky (in apparatus where available space is typically very confined) and prone to malfunction. Moreover, such a technique only allows near-simultaneous rather than truly simultaneous recording of the various spectral components and, in principle, fluctuations can still occur between component exposures, thereby causing an intrinsic uncertainty/error margin in results.

It is an object of the invention to address these issues. In particular, it is an object of the invention to provide a method that does not require the use of ultra-fast components, such as deflectors and beam-blankers. Moreover, it is an object of the invention that such a method should facilitate more accurate spectral analysis than the prior art, by allowing truly simultaneous rather than consecutive measurement of various spectral components.

These and other objects are achieved in a method as set forth in the opening paragraph above, which method is characterized by the following steps:

Using an adjustable aperture device to admit a first portion of said array to a detector, while blocking a second portion of said array;

Providing a radiation sensor in said flux upstream of said aperture device;

Using said sensor to perform localized radiation sensing in a selected region of said second portion of the array, simultaneous with detection of said first portion by said detector;

Using a sensing result from said sensor to adjust a detection result from said detector.

It should be noted that the phrase "upstream" as here employed should be interpreted as indicating that the radiation sensor is located between the dispersing device and the adjustable aperture device, including a possible configuration whereby the sensor is located right up against the aperture device (abutment/juxtaposition).

The inventive method is inherently different to the prior art in that, by employing the inventive radiation sensor in parallel with said detector, and by locating these two recording devices at different sides of the adjustable aperture device (which acts as a "spectral selector" or "spatial filter"), they can be simultaneously set to two different intensity/energy thresholds, allowing two very different components of the spectrum to be simultaneously recorded. For example, in the case of an EELS spectrum as discussed above:

The adjustable aperture device can be configured so as to admit the relatively high-energy-loss CLP component [first spectral portion] to said detector, whilst blocking out the spectral sub-beams of the lower-energy-loss components (comprising the ZLP/PRP components) [second spectral portion].

Because the (main) detector is only exposed to the relatively faint, high-energy-loss CLP component, its sensitivity/exposure time can be optimized to record this. On the other hand, because the (ancillary) sensor is located prior to the aperture device, and because it can perform localized sensing (e.g. due to limited size), it can be used to independently (and simultaneously) probe (one or more selected regions of) said second spectral portion, with a sensitivity/exposure time that is tailored to the relatively bright, low-energy-loss ZLP/PRP features in this portion.

It is clear that the above-mentioned approach is truly simultaneous, and does not require the ultra-fast switching devices (deflectors/blankers) of the Dual EELS approach. Moreover, the employed radiation sensor can be a relatively straightforward, robust and inexpensive device, thus allowing the inventive set-up to be typically cheaper, more compact and hardier than a Dual EELS module.

In a particular embodiment of the invention, the radiation sensor is movable in at least a direction parallel to a dispersion direction of the dispersing device. As indicated in the previous two paragraphs, the inventive sensor can perform localized sensing in a relatively confined "selected region". To capitalize on this effect, it is advantageous to be able to choose/adjust the selected region concerned, and an effective way to achieve this is to embody the sensor to be movable, e.g. by attaching it to an arm that is driven/positioned by an actuator (such as a piezo motor, stepper motor, voice coil motor, pneumatic/hydraulic drive, etc.). If one defines a Cartesian coordinate system (XYZ) in which:

the charged particle flux leaving the dispersing device propagates along the Z direction;
the dispersing device fans out/disperses this flux in the X direction, then, in the current embodiment, the sensor should be movable in at least said X direction, but may, of course, also be movable in other directions. In conjunction with a relatively small sensor area (e.g. of the order of a few $mm^2$), such sensor mobility allows one, for example, to exclusively record a signal from (particular zones of) the ZLP or PRP spectral components in an EELS spectrum.

As an alternative (or supplement) to using a movable sensor, one could, for example, embody the sensor to be pixelated, comprising a matrix of pixels distributed in the XY plane (or just a linear arrangement of pixels extending in the X direction). In such a scenario, one could choose the "selected region" simply by activating/reading out a relevant subset of the pixel matrix. A hybrid embodiment—involving a movable sensor that is also pixelated as just described—is also possible.

Regardless of the nature/extent of the sensor's possible mobility, it can be selected from a group of various sensor types, including, for example, SSPMs, photodiodes, (pixelated) CMOS detectors, (pixelated) CCD detectors, photovoltaic cells, etc., which may, for example, be used in conjunction with a scintillator film, for instance In principle, the adjustable aperture device can take various possible forms. However, in a specific embodiment of the invention, the adjustable aperture device comprises a first plate having a first edge and a second plate having a second edge, said edges opposing each other across an intervening gap (aperture), at least said first plate being connected to an actuator that can be used to move it relative to said second plate so as to adjust said gap. In such an embodiment, the first and second plates behave somewhat like cooperating jaws (mandibles) whose edges delimit an intermediate gap (mouth), the width of the gap being adjusted by moving at least one of the jaws relative to the other. In a preferential configuration, the gap is elongate, and extends substantially perpendicular to said dispersion direction (i.e. it extends parallel to Y in the Cartesian system defined above, with an adjustable width parallel to X). The (knife) edges of the opposing plates may be straight or curved, as desired. Said actuator may, for example, be a piezo motor, stepper motor, voice coil motor, pneumatic/hydraulic drive, etc. In particular, a piezo motor is a good choice, because it is generally relatively small and cheap, and very accurate.

If required, it is possible to aim/shift the array of spectral sub-beams falling upon the aperture device by appropriately adjusting, for example, (an electrical signal to) the dispersing device and/or a drift tube/deflector provided between the dispersing device and aperture device, for instance. More specifically, one can adjust the width of the aperture (gap) to correspond to the width of the desired first spectral portion, and can adjust the aim/position of the spectrum so as to ensure that said first spectral portion falls accurately within this aperture (gap), while other portions of the spectrum are eclipsed (by the first and second plates adjoining the gap). The skilled artisan will understand that the adjustable aperture device is advantageously disposed at a location at or proximal to a dispersion plane of the spectroscopic apparatus. Similarly, the inventive radiation sensor is also advantageously located at or proximal to such a plane.

In a related embodiment of the invention to that just described, the radiation sensor is attached to a side of said first plate distal from said detector and proximal to said first edge. In other words, the sensor rides "piggyback" on the side of the (movable) first plate facing the incoming flux, and located near (or at) the first edge. This is a convenient way of achieving the sensor mobility already discussed above. It is also a convenient way of ensuring that the aperture (of the adjustable aperture device) and radiation sensor are substantially co-planar. Moreover, the plate to which the sensor is attached can conveniently act as a "mass" for the sensor, e.g. in terms of electrical grounding, thermal draining, etc.

In a further embodiment of the invention, the radiation sensor is arranged to extend in a transverse direction substantially perpendicular to said dispersion direction. Using the Cartesian system introduced above, this means that the sensor extends in (at least) the Y direction. An advantage of such an arrangement is that it can cope with non-optimal alignment of the flux/array of spectral sub-beams in said transverse direction. Moreover, if there is intrinsically some radiation spread in this transverse direction, the current embodiment will allow more of that radiation to be captured by the sensor, thus giving a better sensitivity/signal-to-noise ratio.

An important aspect of the invention is that a detection result from the employed detector (which "views" a first portion of the spectrum concerned) is adjusted using a sensing result from the employed radiation sensor (which "views" a selected region of a second portion of the spectrum). Said detection result adjustment may, for example comprise at least one of the following actions:
  (i) Deconvolving said detection result using said sensing result and said detection result as input to a mathematical deconvolution procedure;
  (ii) Correcting for a contribution of an instrument-related transfer function in said detection result;
  (iii) Determining an absolute energy scale for said detection result;
  (iv) Determining an absolute intensity scale for said detection result.
These actions can be elucidated in more detail as follows:
  (I) As already indicated above in the discussion of EELS spectra, the CLP and PRP spectral components are convoluted, because a given electron entering the EELS module can, in general, have caused a mixture of (inner-shell) CLP and (outer-shell) PRP "events" in the specimen under investigation. If the CLP and PRP components are separately measured, they can be deconvolved ("disentangled") using mathematical procedures based, for example, on Bayesian, Fourier Log or Fourier Ratio techniques: see, for instance, the dissertation in Embodiment 3 below.
  (II) The detection and sensing results will be distorted/deformed as a result of various instrument-related effects, such as dark signals, response time effects, hysteresis, artifacts, noise, etc. Such effects can also be deconvoluted out of the detection result with the aid of the sensing result, e.g. in a manner as elucidated in (I) above.
  (III) Returning to the EELS example discussed above, the ZLP can act as an absolute energy reference for the PRP/CLP parts of a spectrum, because the energy of electrons in the incoming flux is known (on the basis of the employed (resultant) acceleration potential) and the ZLP portion of the spectrum effectively "preserves" this energy. By comparing the peak positions in the CLP/PRP component to the ZLP peak position, an absolute (rather than relative) energy scale can be associated with them.
  (IV) In a related way to that in which the position (abscissa) of a CLP/PRP peak can be calibrated (rendered absolute) by comparison to the position of the ZLP peak, it is also possible to calibrate/normalize the peak height (intensity) using the current invention—whereby the ZLP peak height is used as a calibration reference for peak heights in the CLP/PRP spectral portion. In so doing, one can make allowances for such effects as intensity variations in the incoming charged-particle flux, thickness-variations in the specimen, etc.
In addition to such actions, data from the radiation sensor can also be used for other purposes. For example, a comparison of an integrated intensity of the (ZLP+PRP) components relative to an integrated intensity of the PRP component can allow one to deduce the thickness of the specimen under investigation.

More information on such issues can, for example, be gleaned from the abovementioned book by Egerton (e.g. Chapter 4).

In a particular embodiment, data from the radiation sensor can be used as input to a feedback loop to adjust an output of a power supply connected to at least one of said source, illuminator, imaging system and dispersing device. As discussed above, instabilities/fluctuations in the (high-tension) electrical power supplied to such modules can manifest themselves in fluctuations in the ZLP (energy) position. Tracking of this position (via the radiation sensor of the invention) can thus allow feedback stabilization of the supplied power.

The invention will now be elucidated in more detail on the basis of exemplary embodiments and the accompanying schematic drawings, in which:

FIG. 1 renders a longitudinal cross-sectional view of a charged-particle microscope in which an embodiment of the current invention is enacted.

Figure 2:
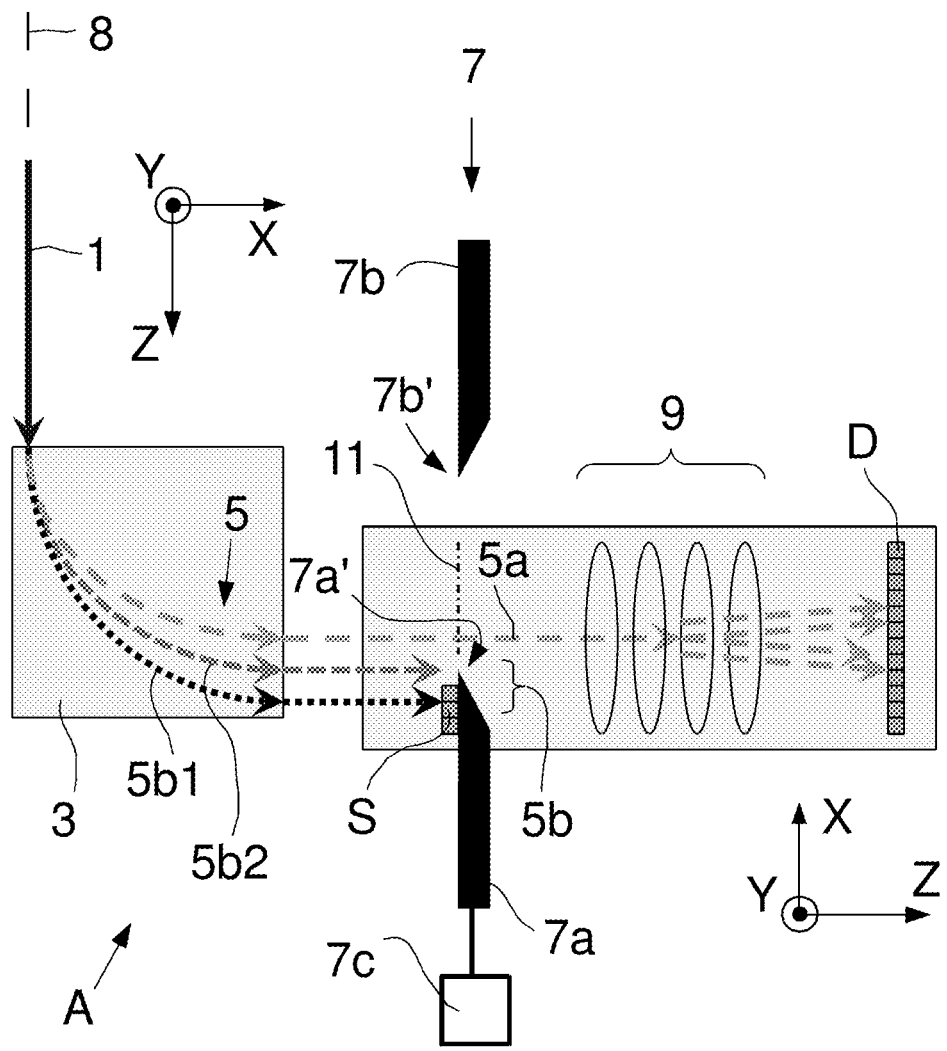

FIG. 2 renders an enlarged longitudinal cross-sectional view of part of the subject of FIG. 1, namely a spectroscopic apparatus in which an embodiment of the present invention is enacted.

Figure 3:
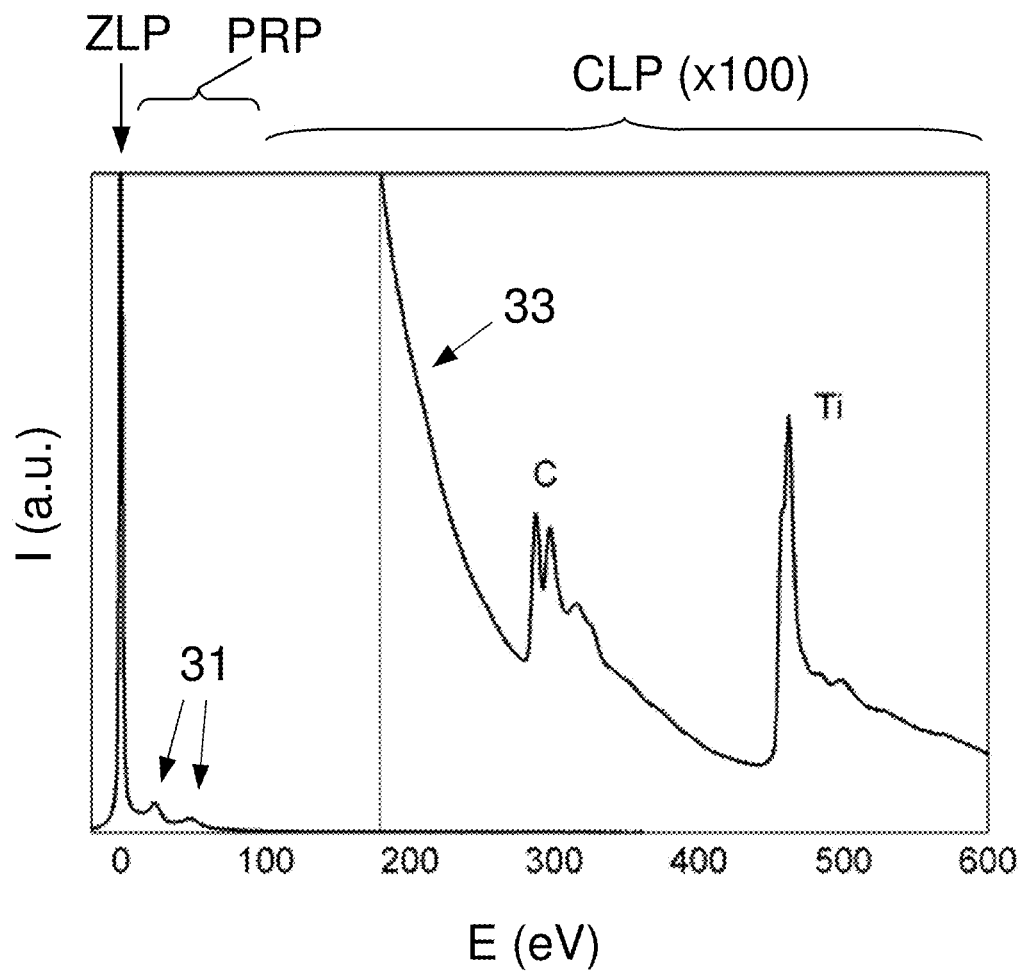

FIG. 3 shows an example of an EELS spectrum.

In the Figures, where pertinent, corresponding parts are indicated using corresponding reference symbols. It should be noted that, in general, the Figures are not to scale.

EMBODIMENT 1

FIG. 1 is a highly schematic depiction of an embodiment of a TCPM M that lends itself to use in conjunction with the current invention; the depicted microscope is a TEM/STEM (i.e. a TEM, with scanning functionality) but, in the context of the current invention, it could just as validly be an ion-based microscope, for example. In the Figure, within a vacuum enclosure 2, an electron source 4 (such as a Schottky gun, for example) produces a beam of electrons that traverse an electron-optical illuminator 6, serving to direct/focus them onto a chosen part of a specimen P (which may, for example, be (locally) thinned/planarized). This illuminator 6 has an electron-optical axis 8, and will generally comprise a variety of electrostatic/magnetic lenses, (scan) deflectors, correctors (such as stigmators), etc.; typically, it can also comprise a condenser system (the whole of item 6 is sometimes referred to as "a condenser system").

The specimen P is held on a specimen holder 10 that can be positioned in multiple degrees of freedom by a positioning device (stage) 12; for example, the specimen holder 10 may comprise a finger that can be moved (inter alia) in the XY plane (see the depicted Cartesian coordinate system; typically, motion parallel to Z and tilt about X/Y will also be possible). Such movement allows different parts of the specimen P to be irradiated/imaged/inspected by the electron beam traveling along axis 8 (in the Z direction) (and/or allows scanning motion to be performed, as an alternative to beam scanning). An optional cooling device 14 is in intimate thermal contact with the specimen holder 10, and is capable of maintaining the latter at cryogenic temperatures, e.g. using a circulating cryogenic coolant to achieve and maintain a desired low temperature.

The (focused) electron beam traveling along axis 8 will interact with the specimen P in such a manner as to cause various types of "stimulated" radiation to emanate from the specimen P, including (for example) secondary electrons, backscattered electrons, X-rays and optical radiation (cathodoluminescence). If desired, one or more of these radiation types can be detected with the aid of analysis device 22, which might be a combined scintillator/photomultiplier or EDX (Energy-Dispersive X-Ray Spectroscopy) module, for instance; in such a case, an image could be constructed using basically the same principle as in a SEM. However, alternatively or supplementally, one can study electrons that traverse (pass through) the specimen P, emerge from it and continue to propagate (substantially, though generally with some deflection/scattering) along axis 8. Such a transmitted electron flux enters an imaging system (combined objective/ projection lens) 24, which will generally comprise a variety of electrostatic/magnetic lenses, deflectors, correctors (such as stigmators), etc. In normal (non-scanning) TEM mode, this imaging system 24 can focus the transmitted electron flux onto a fluorescent screen 26, which, if desired, can be retracted/withdrawn (as schematically indicated by arrows 28) so as to get it out of the way of axis 8. An image (or diffractogram) of (part of) the specimen P will be formed by imaging system 24 on screen 26, and this may be viewed through viewing port 30 located in a suitable portion of the wall 2. The retraction mechanism for screen 26 may, for example, be mechanical and/or electrical in nature, and is not depicted here.

As an alternative to viewing an image on screen 26, one can instead make use of the fact that the depth of focus of the electron flux emerging from imaging system 24 is generally quite large (e.g. of the order of 1 meter). Consequently, various other types of analysis apparatus can be used downstream of screen 26, such as:

TEM camera C. At camera C, the electron flux can form a static image (or diffractogram) that can be processed by controller 50 and displayed on a display device (not depicted), such as a flat panel display, for example. When not required, camera C can be retracted/withdrawn (as schematically indicated by arrows 28') so as to get it out of the way of axis 8.

STEM detection device C'. An output from device C' can be recorded as a function of (X,Y) scanning beam position on the specimen P, and an image can be constructed that is a "map" of output from C' as a function of X,Y. Device C' can comprise a single pixel with a diameter of e.g. 20 mm, as opposed to the matrix of pixels characteristically present in camera C. Moreover, device C' will generally have a much higher acquisition rate (e.g. $10^6$ points per second) than camera C (e.g. $10^2$ images per second). Once again, when not required, device C' can be retracted/withdrawn (as schematically indicated by arrows 28") so as to get it out of the way of axis 8.

As an alternative to imaging using camera C or device C', one can also invoke spectroscopic apparatus A, which, in the current example, is an EELS module. The further structure and operation of spectroscopic apparatus A will be elucidated below with reference to FIG. 2.

It should be noted that the order/location of items C, C' and A is not strict, and many possible variations are conceivable. For example, spectroscopic apparatus A can also be integrated into the imaging system 24.

Note that the controller (computer processor) 50 is connected to various illustrated components via control lines (buses) 50'. This controller 50 can provide a variety of functions, such as synchronizing actions, providing setpoints, processing signals, performing calculations, and displaying messages/information on a display device (not depicted). Needless to say, the (schematically depicted) controller 50 may be (partially) inside or outside the enclosure 2, and may have a unitary or composite structure, as desired. The skilled artisan will understand that the interior of the enclosure 2 does not have to be kept at a strict vacuum; for example, in a so-called "Environmental TEM/STEM", a background atmosphere of a given gas is deliberately introduced/maintained within the enclosure 2. The skilled artisan will also understand that, in practice, it may be advantageous to confine the volume of enclosure 2 so that, where possible, it essentially hugs the axis 8, taking the form of a small tube (e.g. of the order of 1 cm in diameter) through which the employed electron beam passes, but widening out to accommodate structures such as the source 4, specimen holder 10, screen 26, camera C, detection device C', spectroscopic apparatus A, etc.

Turning now to FIG. 2, this shows an enlarged and more detailed view of the spectroscopic apparatus A in FIG. 1. In the Figure, a flux 1 of electrons is shown propagating along electron-optical axis 8. This flux 1 enters a dispersing device 3 ("electron prism"), where it is dispersed (fanned out) into an energy-resolved (energy-differentiated) array 5 of spectral sub-beams (schematically indicated in FIG. 2 using dashed lines). This array 5 of sub-beams encounters an adjustable aperture device 7, which comprises:

A first plate 7a, having a first (knife) edge 7a';
A second plate 7b, having a second (knife) edge 7b' and arranged to be substantially co-planar with first plate 7a;
An actuator 7c, which can be used to move plate 7a toward or away from plate 7b, thereby adjusting the width (height) of an intervening gap between the two edges 7a', 7b'.

The aperture device 7 is used as a spatial filter/spectral selector, and is adjusted so as to admit a first portion 5a of array 5 to a detector D (e.g. a pixelated CMOS or CCD detector), while blocking a second portion 5b of array 5 from reaching detector D. Before reaching detector D, said admitted first portion 5a proceeds through post-aperture electron optics 9, where it is magnified/focused, for example. The first portion 5a and second portion 5b will each generally comprise a non-zero bandwidth of sub-beams.

Also depicted is a radiation sensor S, which is disposed upstream of aperture device 7, i.e. at a side of aperture device 7 facing toward the incoming sub-beam array 5/distal from detector D. In this particular case, sensor S is attached to first plate 7a proximal to first edge 7a', and is thus co-movable with first plate 7a. The sensor S is relatively small, e.g. with a sensing area of a few mm$^2$, and is, for example, embodied as a photodiode, SSPM or (small) CMOS/CCD sensor. In accordance with the present invention, the sensor S is used to perform localized radiation sensing in a selected region 5b1 of said second portion 5b of the array 5, simultaneous with detection of said first portion 5a by detector D. This selected region is, as its name indicates, selectable: for example, by moving blade 7a slightly toward blade 7b in FIG. 2, one could instead use sensor S to inspect a selected region 5b2—though this might lead to the eclipsing of a small peripheral zone of admitted first portion 5a.

In further accordance with the invention, a sensing result from sensor S is used to adjust a detection result from detector D. To give a specific example:

First portion 5a comprises the CLP spectral component, which is detected by detector D.
Second portion 5b comprises the ZLP spectral component 5b1 and the PRP spectral component 5b2.
As depicted in FIG. 2, selected region 5b1 is being sensed by sensor S. However, by appropriately moving blade 7a, one could alternatively (or concurrently) arrange for selected region 5b2 to be sensed by sensor S.
A sensing result from region 5b1 (~ZLP) can be used to calibrate an absolute energy scale for a detection result (~CLP) from detector D. When combined with a sensing result from region 5b2 (~PRP), it can be used to deconvolve a detection result (~CLP) from detector D.

Note that the Cartesian coordinate system depicted at the lower right of FIG. 2 is rotated counterclockwise through 90° compared to the coordinate system at the upper left of the Figure because, conventionally, the Z axis indicates the direction of the (local) electron-optical axis 8, which is deflected in dispersing device 3.

EMBODIMENT 2

FIG. 3 shows an example of an EELS spectrum. The Figure renders intensity I (in arbitrary units, a.u.) as a function of energy-loss E (in eV) for electrons that have traversed a specimen containing Carbon and Titanium. From left to right, the main features of the spectrum are:
- A Zero-Loss Peak ZLP, representing electrons that traverse the specimen without undergoing inelastic scattering therein.
- A Plasmon Resonance Peak component/section PRP (sometimes referred to as a Valence Loss component). This typically extends from about 0-50 eV, although there is no strict definition of its upper limit. It is characterized by peaks/shoulders resulting from outer-shell scattering events in the specimen, such as peaks 31. Note that the PRP component usually has a significantly lower intensity than the ZLP.
- A Core Loss Peak component/section CLP. This typically starts at about 50 eV (after the PRP component), although there is no strict definition of its lower limit. It is typically of such a low intensity relative to the ZLP/PRP components that, as rendered in FIG. 3, it is enlarged by a factor 100 to improve visibility of its details. As can be seen, it contains (clusters of) peaks/shoulders that can be associated with certain chemical elements (such as C and Ti, in the current example), seated on top of a substantial background contribution 33.

EMBODIMENT 3

The resolution of the EELS module can be limited by many effects, such as Poisson noise (or "shot noise") in the electron beam, detector read-out noise, the energy spread of the electron source, optical aberrations in the EELS module, the finite spatial resolution of the detector in the EELS module, electrical instabilities in the employed power supplies, mechanical vibrations, etc. As a result, the "ideal" or "real" EELS spectrum $S_{real}(E)$ is recorded by the EELS module as an experimental spectrum $S_{exp}(E)$, with:

$$S_{exp}(E) = R(E) * S_{real}(E) + N(E),$$

where R(E) represents (cumulative) broadening effects, N(E) represents (cumulative) noise, and the star symbol ("*") denotes convolution:

$$R(E) * S_{real}(E) = \int R(F) S_{real}(E-F) dF.$$

In the absence of a specimen, the ideal spectrum contains only the ZLP peak, and thus the ideal spectrum can be written as a delta function, $S_{real}(E) = \delta(E)$; in that case, the recorded spectrum simplifies to:

$$S_{exp}(E) = R(E) + N(E).$$

In the presence of a specimen, electrons in the beam can scatter one or more times on plasmons in the specimen. Let P(E) denote these PRP contributions to the EELS spectrum, in which case the ideal spectrum is:

$$S_{real}(E) = \delta(E) + P(E),$$

and the EELS module records this as:

$$S_{exp}(E) = R(E) + R(E) * P(E) + N(E).$$

Electrons in the beam can also scatter on core electrons in the specimen, thus generating the core-loss contribution. Let C(E) denote the CLP contribution to the EELS spectrum. In the absence of PRP contributions, the ideal spectrum is:

$$S_{real}(E) = \delta(E) + C(E),$$

and the EELS module records this as:

$$S_{exp}(E) = R(E) + R(E) * C(E) + N(E).$$

When both PRP and CLP contribute to the spectrum, the ideal spectrum becomes:

$$S_{real}(E) = (\delta(E) + P(E)) * (\delta(E) + C(E)$$
$$= \delta(E) + P(E) + C(E) + P(E) * C(E),$$

and the EELS module records this as:

$$S_{exp}(E) = R(E) + R(E) * P(E) + R(E) * C(E) + R(E) * P(E) * C(E) + N(E).$$

Here the convolution P(E)*C(E) represents the contribution of electrons in the beam which have experienced a scattering with the plasmons, followed or preceded by a scattering on the core electrons.
The contribution R(E)*P(E)*(CE) complicates a quantitative analysis of the CLP spectrum and, therefore, it is desirable to extract this contribution from the experimental spectrum. This can be done using deconvolution: the EELS module can (for example) be configured such that the aforementioned detector records the CLP part of the spectrum:

$$S_{CLP}(E) = R(E) * C(E) + R(E) * P(E) * C(E) + N(E),$$

while the aforementioned radiation sensor records the PRP part of the spectrum:

$$S_{PRP}(E) = R(E) + R(E) * P(E) + N(E).$$

The spectra recorded on the detector and on the sensor are both Fourier-transformed from the energy domain E to the frequency domain w according to:

$$S(w) = \int S(E) e^{2\pi i E w} dE.$$

As is well-known, the Fourier-transformation transforms the convolutions in the energy domain to straightforward multiplications in the frequency domain, so that:

$$S_{CLP}(w) = R(w) \cdot C(w) + R(w) \cdot P(w) \cdot C(w) + N(w)$$

and $$S_{PRP}(w) = R(w) + R(w) \cdot P(w) + N(w).$$

The "bare" core-loss spectrum can then be found by dividing the detector signal $S_{CLP}(w)$ by the sensor signal $S_{PRP}(w)$:

$$S_{CLP}(w) / S_{PRP}(w) = [R(w) \cdot C(w) + R(w) \cdot P(w) \cdot C(w) + N(w)] / [R(w) + R(w) \cdot P(w) + N(w)]$$
$$= C(w) + N(w) \cdot [1 - C(w)] / [R(w) + R(w) \cdot P(w) + N(w)].$$

The first term in the last expression represents the ideal bare core-loss spectrum. The second term represents the uncertainty in this core-loss spectrum due to noise in the measurement. For low frequencies w, the noise N(w) is typically much smaller than the ZLP signal R(w), i.e. N(w)<<R(w), so that the contribution of this second term is negligible. For high frequencies w, the noise N(w) can become significant, whence some form of regularization must be applied to this term. Such regularization schemes are known to the skilled artisan in the field of deconvolution of noisy data. One example of a known regularization method is to multiply $S_{CLP}(w)/S_{PRP}(w)$ by a low-pass filter function f(w) that goes (smoothly) to zero for frequencies w above the frequency $w_0$ corresponding to the (estimated) energy resolution of the system. Another example of a known regularization method is "Bayesian deconvolution" in which $S_{CLP}(w)/S_{PRP}(w)/S_{PRP}(w)$ is iteratively approached by a fit function that optimally fits the data given a known (or assumed) size of the noise and given the constraint that the fit function should be as smooth as possible.

The invention claimed is:

1. A method of performing spectroscopy in a Transmission Charged-Particle Microscope including:
   a specimen holder, for holding a specimen;
   a source, for producing a beam of charged particles;
   a illuminator, for directing said beam so as to irradiate the specimen;
   a imaging system, for directing a flux of charged particles transmitted through the specimen onto a spectroscopic apparatus comprising a dispersing device for dispersing said flux into an energy-resolved array of spectral sub-beams,
   the method comprising:
   using an adjustable aperture device to admit a first portion of said array to a detector, while blocking a second portion of said array;
   providing a radiation sensor in said flux upstream of said aperture device;
   using said sensor to perform localized radiation sensing in a selected region of said second portion of the array, simultaneous with detection of said first portion by said detector; and
   using a sensing result from said sensor to adjust a detection result from said detector.

2. A method according to claim 1, wherein:
   said spectroscopic apparatus is an electron energy loss spectroscopy (EELS) device;
   said first portion comprises an EELS Core Loss Peak;
   said selected region comprises a feature selected from the group comprising an EELS Zero Loss Peak and an EELS Plasmon Resonance Peak.

3. A method according to claim 1, wherein said radiation sensor is movable in at least a direction parallel to a dispersion direction of said dispersing device.

4. A method according to claim 1, wherein said adjustable aperture device comprises a first plate having a first edge and a second plate having a second edge, said edges opposing each other across an intervening gap, at least said first plate being connected to an actuator that can be used to move it relative to said second plate so as to adjust said gap.

5. A method according to claim 4, wherein said sensor is attached to a side of said first plate distal from said detector and proximal to said first edge.

6. A method according to claim 1, wherein said sensor is arranged to extend in a transverse direction substantially perpendicular to a dispersion direction of said dispersing device.

7. A method according to claim 1, wherein said detection result adjustment comprises at least one of the following actions:
   deconvolving said detection result using said sensing result and said detection result as input to a mathematical deconvolution procedure;
   correcting for a contribution of an instrument-related transfer function in said detection result;
   determining an absolute energy scale for said detection result;
   determining an absolute intensity scale for said detection result.

8. A method according to claim 1, wherein said sensing result is used as input to a feedback loop to adjust an output of a power supply connected to at least one of said source, illuminator, imaging system and dispersing device.

9. A method according to claim 1, wherein an integrated intensity of the detection result is compared to an integrated intensity of the sensor result so as to derive a thickness value for the specimen.

10. A Transmission Charged-Particle Microscope, comprising:
    a specimen holder, for holding a specimen;
    a source, for producing a beam of charged particles;
    an illuminator, for directing said beam so as to irradiate the specimen;
    an imaging system, for directing a flux of charged particles transmitted through the specimen onto a spectroscopic apparatus comprising:
    a dispersing device, for dispersing said flux into an energy-resolved array of spectral sub-beams;
    a detector;
    a controller, for executing control commands,
    in which:
    the spectroscopic apparatus comprises:
    an adjustable aperture device, to admit a first portion of said array to the detector, while blocking a second portion of said array;
    a radiation sensor provided upstream of said aperture device;
    said controller is programmed to perform the following actions:
    use said sensor to perform localized radiation sensing in a selected region of said second portion of the array, simultaneous with detection of said first portion by said detector;
    use a sensing result from said sensor to adjust a detection result from said detector.

11. The transmission charged-particle microscope of claim 10, wherein said spectroscopic apparatus further comprises an electron energy loss spectroscopy (EELS) device;
    said first portion comprises an EELS core loss peak; and
    said selected region comprises a feature selected from the group comprising an EELS zero loss peak and an EELS plasmon resonance peak.

12. The transmission charged-particle microscope of claim 10, wherein said radiation sensor is movable in at least a direction parallel to a dispersion direction of said dispersing device.

13. The transmission charged-particle microscope of claim 10, wherein said adjustable aperture device comprises a first plate having a first edge and a second plate having a second edge, said edges opposing each other across an intervening gap, at least said first plate being connected to an actuator that can be used to move it relative to said second plate so as to adjust said gap.

14. The transmission charged-particle microscope of claim 13, wherein said sensor is attached to a side of said first plate distal from said detector and proximal to said first edge.

15. The transmission charged-particle microscope of claim 10, wherein said sensor is arranged to extend in a transverse direction substantially perpendicular to a dispersion direction of said dispersing device.

16. The transmission charged-particle microscope of claim 10, wherein the controller programmed to adjust a detection result from said detector comprises a controller programmed to perform at least one of the following actions:
- deconvolving said detection result using said sensing result and said detection result as input to a mathematical deconvolution procedure;
- correcting for a contribution of an instrument-related transfer function in said detection result;
- determining an absolute energy scale for said detection result; and
- determining an absolute intensity scale for said detection result.

17. The transmission charged-particle microscope of claim 10, wherein the controller programmed to use a sensing result from said sensor to adjust a detection result from said detector comprises a controller programmed to use the sensing result as input to a feedback loop to adjust an output of a power supply connected to at least one of said source, illuminator, imaging system and dispersing device.

18. The transmission charged-particle microscope of claim 10, wherein the controller is further programmed to compare an integrated intensity of the detection result to an integrated intensity of the sensor result so as to derive a thickness value for the specimen.

* * * * *